United States Patent
Jun et al.

(10) Patent No.: US 12,218,010 B2
(45) Date of Patent: Feb. 4, 2025

(54) VERTICAL FIELD-EFFECT TRANSISTOR DEVICES HAVING GATE LINER

(71) Applicant: Samsung Electronics Co., Ltd., Suwon-si (KR)

(72) Inventors: Hwi Chan Jun, Yongin-si (KR); Min Gyu Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/418,795

(22) Filed: Jan. 22, 2024

(65) Prior Publication Data

US 2024/0170338 A1 May 23, 2024

Related U.S. Application Data

(63) Continuation of application No. 17/669,452, filed on Feb. 11, 2022, now Pat. No. 11,915,982, which is a continuation of application No. 17/035,857, filed on Sep. 29, 2020, now Pat. No. 11,282,752.

(60) Provisional application No. 62/970,278, filed on Feb. 5, 2020.

(51) Int. Cl.
*H01L 21/8234* (2006.01)
*H01L 29/792* (2006.01)

(52) U.S. Cl.
CPC ........... *H01L 21/823487* (2013.01); *H01L 21/823437* (2013.01); *H01L 21/823481* (2013.01)

(58) Field of Classification Search
CPC ..... H01L 21/823437; H01L 21/823481; H01L 21/823487; H01L 29/66666; H01L 29/7827; H01L 29/7926
USPC ........................................................ 257/302
See application file for complete search history.

(56) References Cited

U.S. PATENT DOCUMENTS

| | | |
|---|---|---|
| 9,299,835 B1 | 3/2016 | Anderson et al. |
| 9,443,982 B1 | 9/2016 | Balakrishnan et al. |
| 9,882,048 B2 | 1/2018 | Anderson et al. |
| 9,929,246 B1 | 3/2018 | Cheng et al. |
| 9,954,103 B1 | 4/2018 | Gluschenkov et al. |
| 9,972,494 B1 | 5/2018 | Bentley et al. |
| 10,002,867 B2 | 6/2018 | Tsai et al. |
| 10,002,962 B2 | 6/2018 | Anderson et al. |
| 10,032,676 B1 | 7/2018 | Cheng et al. |
| 10,056,377 B2 | 8/2018 | Bentley et al. |
| 10,079,292 B2 | 9/2018 | Cheng et al. |
| 10,079,299 B2 | 9/2018 | Gluschenkov et al. |
| 10,083,871 B2 | 9/2018 | Cheng et al. |

(Continued)

*Primary Examiner* — Hoai V Pham
(74) *Attorney, Agent, or Firm* — Myers Bigel, P.A.

(57) ABSTRACT

Vertical field-effect transistor (VFET) devices and methods of forming the same are provided. The methods may include forming a lower structure on a substrate. The lower structure may include first and second VFETs, a preliminary isolation structure between the first and second VFETs, and a gate liner on opposing sides of the preliminary isolation structure and between the preliminary isolation structure and the substrate. Each of the first and second VFETs may include a bottom source/drain region, a channel region and a top source/drain region sequentially stacked, and a gate structure on a side surface of the channel region. The preliminary isolation structure may include a sacrificial layer and a gap capping layer sequentially stacked. The methods may also include forming a top capping layer on the lower structure and then forming a cavity between the first and second VFETs by removing the sacrificial layer.

20 Claims, 17 Drawing Sheets

(56) References Cited

U.S. PATENT DOCUMENTS

| | | |
|---|---|---|
| 10,090,303 B2 | 10/2018 | Cheng |
| 10,128,158 B2 | 11/2018 | Anderson et al. |
| 10,134,874 B2 | 11/2018 | Cheng et al. |
| 10,170,479 B2 | 1/2019 | Cheng et al. |
| 10,177,241 B2 | 1/2019 | Park et al. |
| 10,211,316 B2 | 2/2019 | Anderson et al. |
| 10,249,753 B2 | 4/2019 | Anderson et al. |
| 10,256,302 B2 | 4/2019 | Cheng et al. |
| 10,283,416 B2 | 5/2019 | Mallela et al. |
| 10,319,833 B1 | 6/2019 | Jagannathan et al. |
| 10,366,984 B2 | 7/2019 | Balakrishnan et al. |
| 10,367,069 B2 | 7/2019 | Cheng et al. |
| 10,453,934 B1 | 10/2019 | Basker et al. |
| 10,475,905 B2 | 11/2019 | Liu et al. |
| 10,790,357 B2 * | 9/2020 | Hashemi ......... H01L 21/823807 |
| 2018/0114850 A1 | 4/2018 | Zhang |
| 2018/0212040 A1 | 7/2018 | Bao et al. |
| 2018/0226491 A1 | 8/2018 | Bi et al. |
| 2018/0233566 A1 | 8/2018 | Gu et al. |
| 2019/0378765 A1 | 12/2019 | Xie et al. |
| 2021/0217871 A1 | 7/2021 | Li et al. |

* cited by examiner

VERTICAL FIELD-EFFECT TRANSISTOR DEVICES HAVING GATE LINER

CROSS-REFERENCE TO RELATED APPLICATIONS

This application is a continuation of U.S. patent application Ser. No. 17/669,452, filed Feb. 11, 2022, which is a continuation of U.S. patent application Ser. No. 17/035,857, now U.S. Pat. No. 11,282,752, filed Sep. 29, 2020, which claims priority to U.S. Provisional Application No. 62/970,278, entitled VERTICAL FET STRUCTURE WITH AIR-GAP ISOLATION, filed in the USPTO on Feb. 5, 2020, the disclosures of which are hereby incorporated by reference herein in their entirety.

FIELD

The present disclosure generally relates to the field of electronics and, more particularly, to vertical field-effect transistor (VFET) devices.

BACKGROUND

Various structures and manufacturing processes of VFET devices have been researched because of high scalability of VFET devices. Therefore, developing manufacturing processes that improve performance and/or reliability of VFET devices may be beneficial.

SUMMARY

According to some embodiments of the present inventive concept, methods of forming an integrated circuit device may include forming a lower structure on a substrate. The lower structure may include a first vertical field-effect transistor (VFET) and a second VFET on the substrate, a preliminary isolation structure between the first VFET and the second VFET, and a gate liner on opposing sides of the preliminary isolation structure and between the preliminary isolation structure and the substrate. Each of the first VFET and the second VFET may include a bottom source/drain region in the substrate, a channel region and a top source/drain region that may be sequentially stacked on the substrate in a vertical direction, and a gate structure on a side surface of the channel region. The preliminary isolation structure may include a sacrificial layer and a gap capping layer sequentially stacked on the substrate in the vertical direction. The methods may also include forming a top capping layer on the lower structure and then forming a cavity between the first VFET and the second VFET by removing the sacrificial layer.

According to some embodiments of the present inventive concept, methods of forming an integrated circuit device may include forming a first preliminary vertical field-effect transistor (VFET) and a second preliminary VFET on a substrate. The first and second preliminary VFETs may be spaced apart from each other in a horizontal direction and may define a gate opening therebetween. Each of the first and second preliminary VFETs may include a bottom source/drain region in the substrate, a channel region and a mask layer that may be sequentially stacked on the substrate in a vertical direction, and a preliminary gate structure on a side surface of the channel region. The method may also include sequentially forming a preliminary gate liner and a preliminary sacrificial layer in the gate opening and on the first and second preliminary VFETs, forming a gate liner and a sacrificial layer in the gate opening by performing a planarization process, forming a recess in the gate opening on the sacrificial layer by removing a portion of the sacrificial layer, forming a gap capping layer in the recess, forming top source/drain openings on the channel regions of the first and second preliminary VFETs, respectively, by removing the mask layer and a portion of the preliminary gate structure of each of the first and second preliminary VFETs, forming top source/drain regions in the top source/drain openings, respectively, forming a top capping layer on the top source/drain regions, and then forming a cavity between the top source/drain regions by removing the sacrificial layer.

According to some embodiments of the present inventive concept, methods of forming an integrated circuit device may include forming a preliminary vertical field-effect transistor (VFET) on a substrate. The preliminary VFET may include a bottom source/drain region in the substrate, a channel region and a mask layer that may be sequentially stacked on the substrate in a vertical direction, and a preliminary gate structure on a side surface of the channel region. The method may also include sequentially forming a preliminary gate liner, a preliminary sacrificial layer, and a preliminary transistor isolation layer on the preliminary VFET and performing a planarization process until the mask layer is exposed, thereby forming a gate liner, a sacrificial layer, and a transistor isolation layer. The sacrificial layer may include a horizontal portion extending parallel to an upper surface of the substrate, and a vertical portion protruding from the horizontal portion and extending on a side surface of the preliminary VFET. The method may further include forming a recess on the vertical portion of the sacrificial layer by removing a portion of the vertical portion of the sacrificial layer, forming a gap capping layer in the recess, forming a top source/drain opening on the channel region by removing the mask layer and a portion of the preliminary gate structure of the preliminary VFET, forming a top source/drain region in the top source/drain opening, forming a top capping layer on the top source/drain region, forming an opening extending through the top capping layer and the transistor isolation layer and exposing the horizontal portion of the sacrificial layer, forming a cavity by removing the sacrificial layer through the opening, and then forming an isolation plug in the opening.

According to some embodiments of the present inventive concept, integrated circuit devices may include a first vertical field-effect transistor (VFET) and a second VFET on a substrate. Each of the first VFET and the second VFET may include a bottom source/drain region in the substrate, a channel region and a top source/drain region that may be sequentially stacked on the substrate in a vertical direction, and a gate structure on a side surface of the channel region. The first VFET may include a first side surface facing the second VFET, and the second VFET may include a first side surface facing the first VFET. The integrated circuit devices may also include a gate liner continuously extending from the first side surface of the first VFET onto the first side surface of the second VFET and a gap capping layer that is between the first side surface of the first VFET and the first side surface of the second VFET and may include opposing side surfaces contacting the gate liner. The gate liner and the gap capping layer may enclose a cavity.

DETAILED DESCRIPTION

Figure 1:
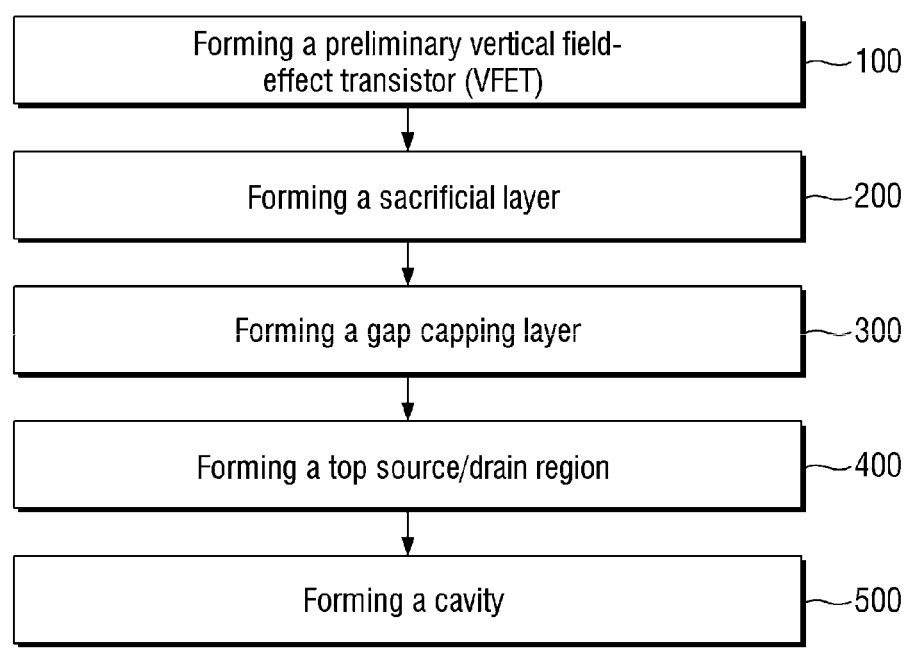
FIGS. 1, 2, and 3 are flowcharts illustrating methods of forming an integrated circuit device including VFETs according to some embodiments of the present inventive concept.
Figure 2:
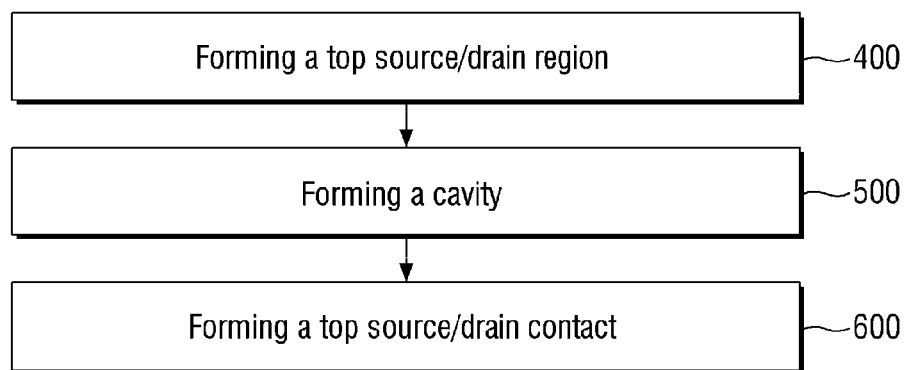
Figure 3:
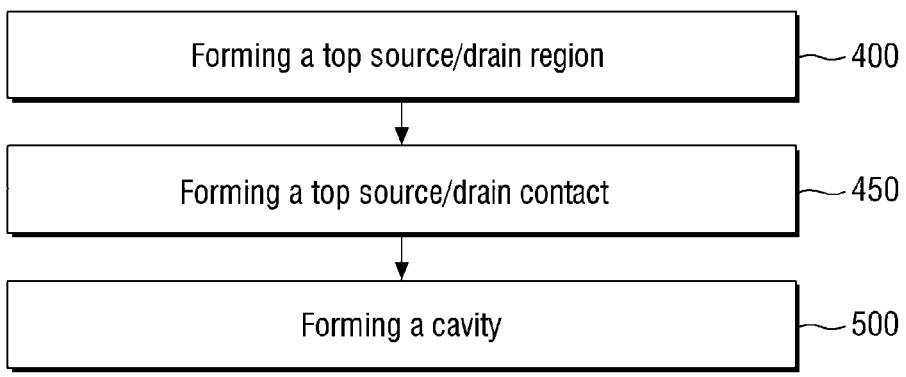

FIGS. 1, 2, and 3 are flowcharts illustrating methods of forming an integrated circuit device including VFETs according to some embodiments of the present inventive concept. Referring to FIG. 1, the methods may include forming a preliminary VFET (e.g., a structure including a bottom source/drain region 22, a channel region 12, a mask layer 14, and a preliminary gate structure 34*p* in FIG. 9) (Block 100) and then forming a sacrificial layer (e.g., a sacrificial layer 44_1 and 44_2 in FIG. 10) (Block 200), forming a gap capping layer (e.g., a gap capping layer 48_1 and 48_2 in FIG. 11) (Block 300), forming a top source/drain region (e.g., a top source/drain region 56 in FIG. 16) (Block 400), and forming a cavity (e.g., a cavity 64 in FIG. 19) (Block 500). Accordingly, the cavity may be formed after the top source/drain region is formed.

Referring to FIG. 2, the methods may further include forming a top source/drain contact (e.g., a top source/drain contact 74 in FIG. 22) (Block 600) after the cavity is formed.

Referring to FIG. 3, the methods may further include forming a top source/drain contact (e.g., a top source/drain contact 74 in FIG. 25) (Block 450) before the cavity is formed.

Figure 7:
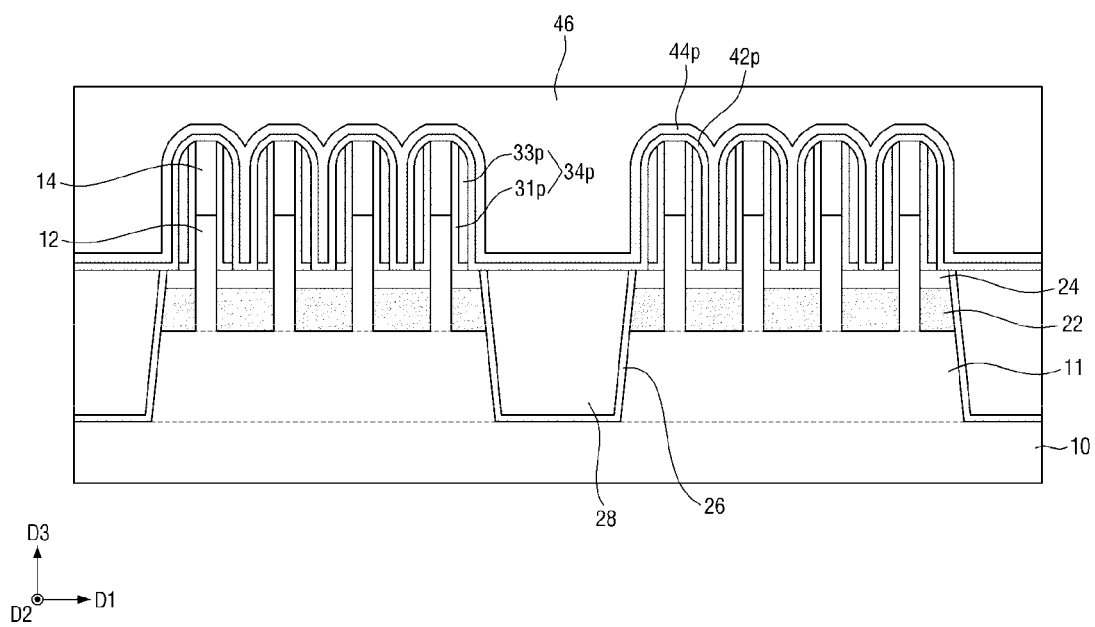
Figure 8:
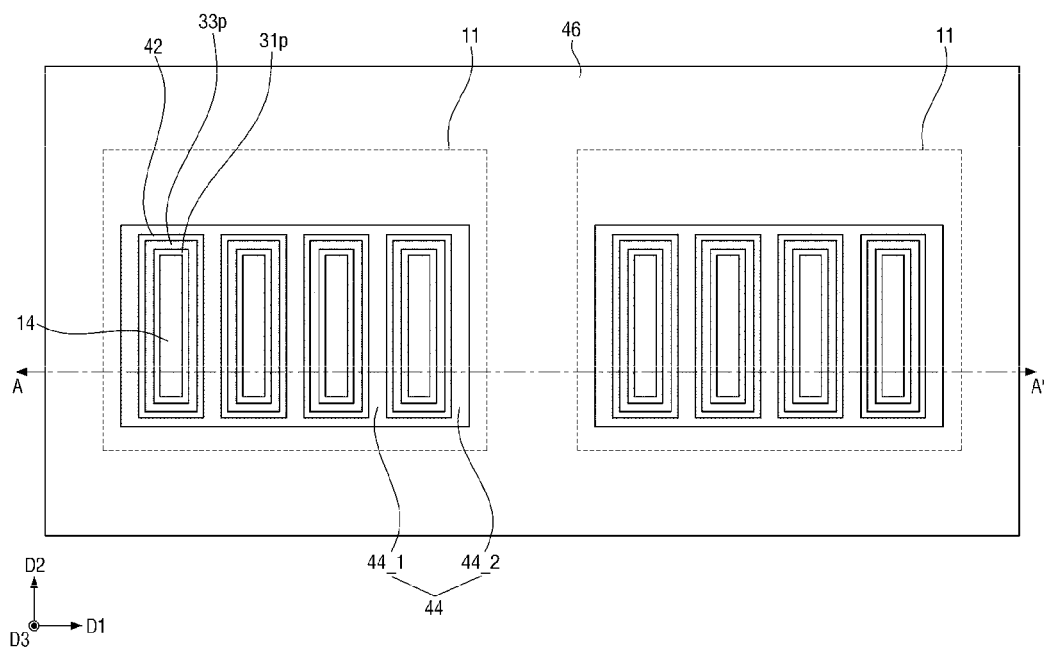
FIGS. 8, 21, and 23 are plan views illustrating methods of forming an integrated circuit device including VFETs according to some embodiments of the present inventive concept.
Figure 20:
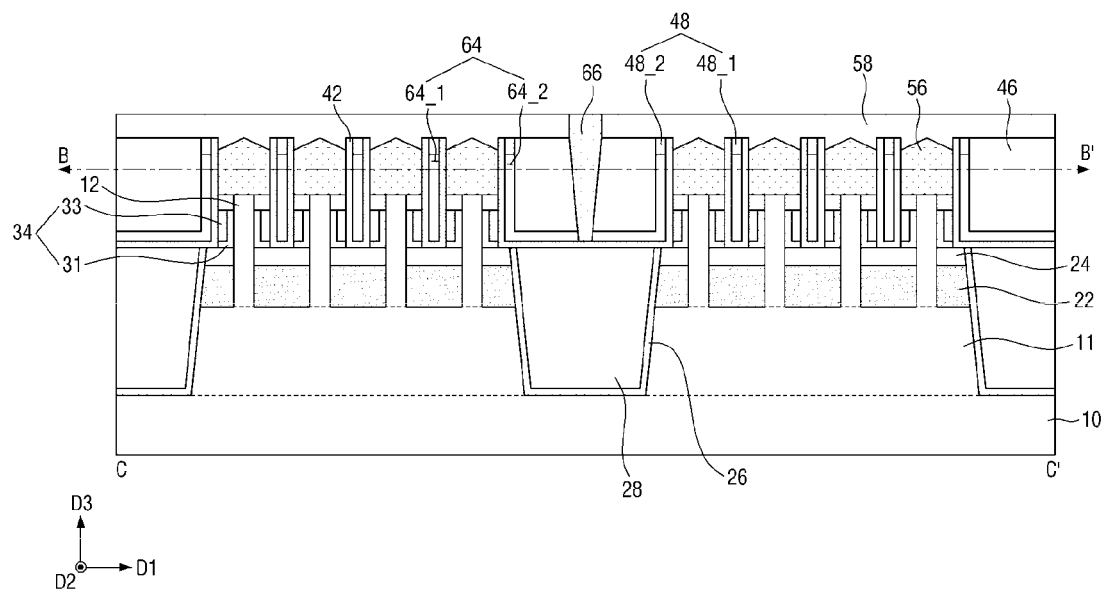
Figure 21:
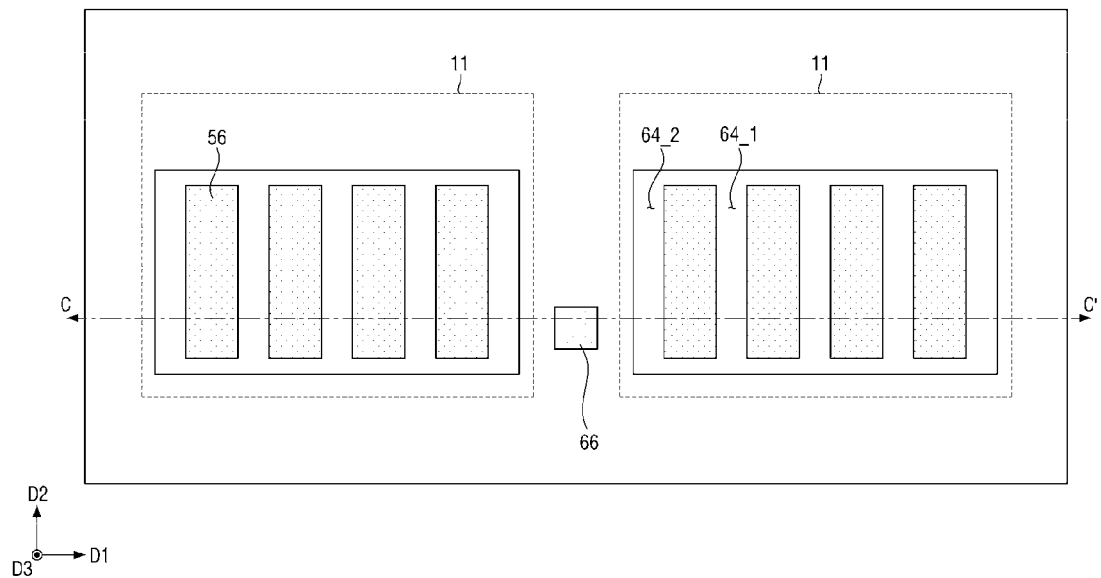
Figure 22:
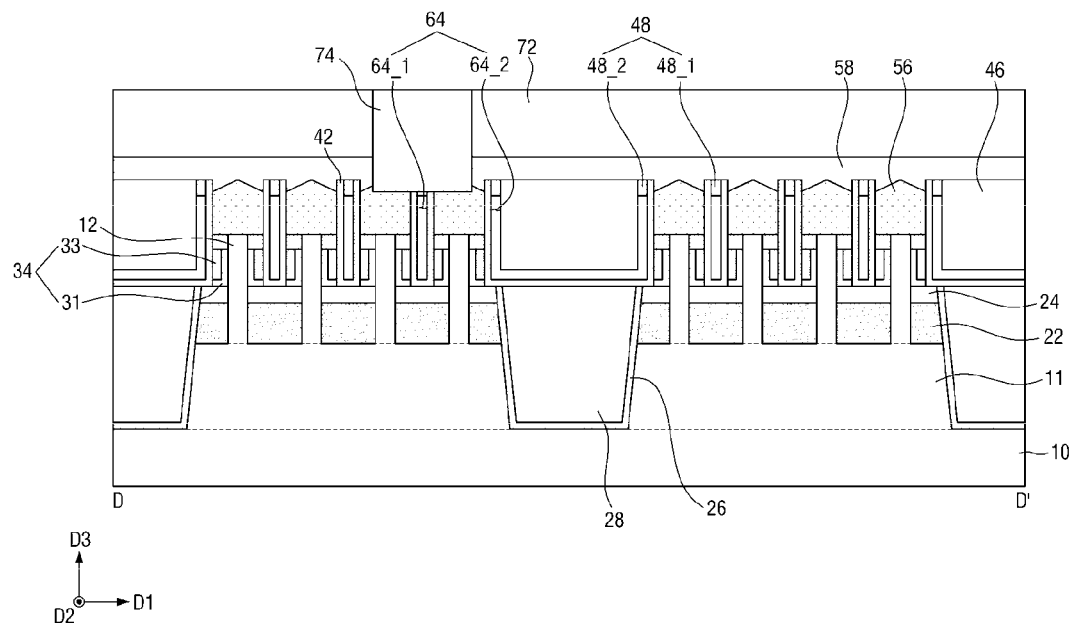
Figure 23:
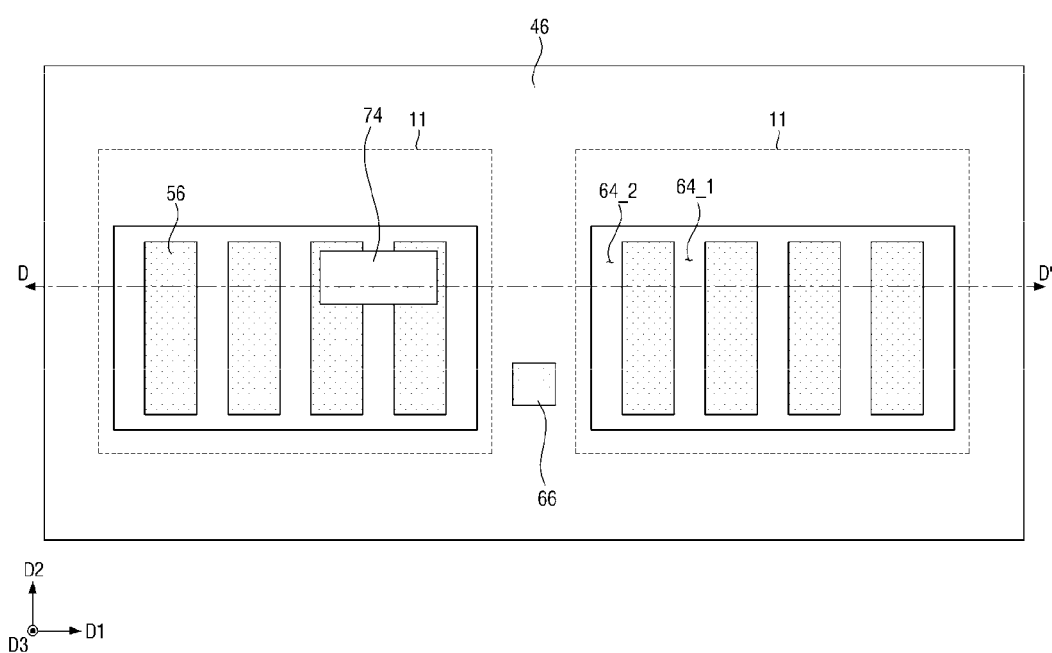

FIGS. 4 through 7, 9 through 20, and 22 are cross-sectional views, and FIGS. 8, 21, and 23 are plan views illustrating methods of forming an integrated circuit device including VFETs according to some embodiments of the present inventive concept.

Figure 4:
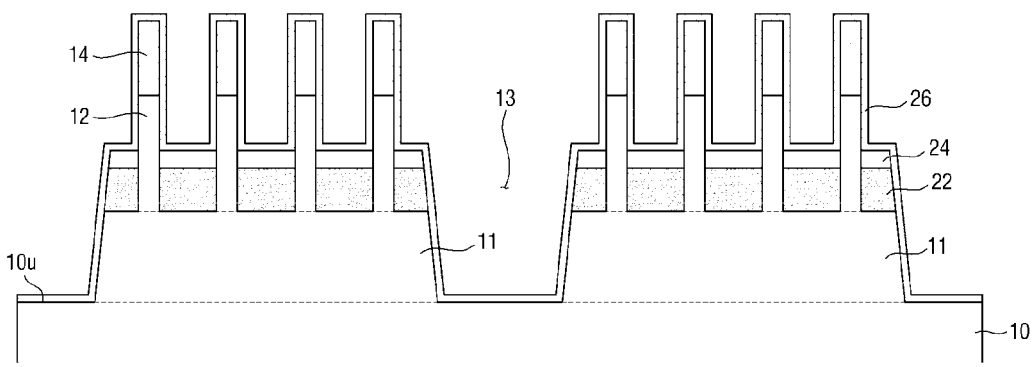
FIGS. 4 through 7, 9 through 20, and 22 are cross-sectional views.

Referring to FIG. 4, an active region 11 may be formed on a substrate 10 by forming a trench 13 in the substrate 10. The active region 11 may protrude from an upper surface 10*u* of the substrate 10 in a third direction D3. The third direction D3 may be perpendicular to the upper surface 10*u* of the substrate 10 and may be a vertical direction. A preliminary channel structure may be formed on the active region 11. The preliminary channel structure may include a channel region 12 and a mask layer 14 sequentially stacked on the substrate 10 in the third direction D3. The channel region 12 may protrude from the active region 11 in the third direction D3.

In some embodiments, forming the preliminary channel structure may include forming the mask layer 14 on the substrate 10 and forming the channel region 12 by etching the substrate 10 using the mask layer 14 as an etch mask. For example, the mask layer 14 may be a hard mask layer including SiN and/or SiON.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

In some embodiments, multiple preliminary channel structures may be formed on a single active region 11 and may be spaced apart from each other in a first direction D1. The first direction D1 may be parallel to the upper surface 10*u* of the substrate 10 and may be a first horizontal direction. Although FIG. 4 shows that four preliminary channel structures are formed on a single active region 11, the present inventive concept is not limited thereto.

A bottom source/drain region 22 and a bottom spacer pattern 24 may be formed on the active region 11. The bottom source/drain region 22 and the bottom spacer pattern 24 may be on a side surface of the channel region 12.

The bottom source/drain region 22 may be formed on the substrate 10 before or after forming the channel region 12. In some embodiments, the bottom source/drain region 22 may be formed by implanting impurity elements (e.g., B, P, and/or As) into the substrate 10. In some embodiments, the bottom source/drain region 22 may be formed by forming an epitaxial layer including impurity elements (e.g., B, P, and/or As) on the substrate 10. The epitaxial layer of the bottom source/drain region 22 may be formed by performing an epitaxial growth process using the substrate 10 as a seed layer.

The bottom spacer pattern 24 may be formed on the bottom source/drain region 22 to electrically isolate the bottom source/drain region 22 from elements subsequently formed on the bottom source/drain region 22 (e.g., a gate electrode 33 in FIG. 13). The bottom spacer pattern 24 may include an insulating material (e.g., silicon oxide, silicon nitride or silicon oxynitride).

An active liner 26 may be formed on the preliminary channel structures and in the trench 13. In some embodiments, the active liner 26 may have a uniform thickness as illustrated in FIG. 4 and may be formed by, for example, an atomic layer deposition (ALD) process. For example, the active liner 26 may include an insulating material (e.g., a silicon layer including nitrogen and/or oxygen).

Figure 5:
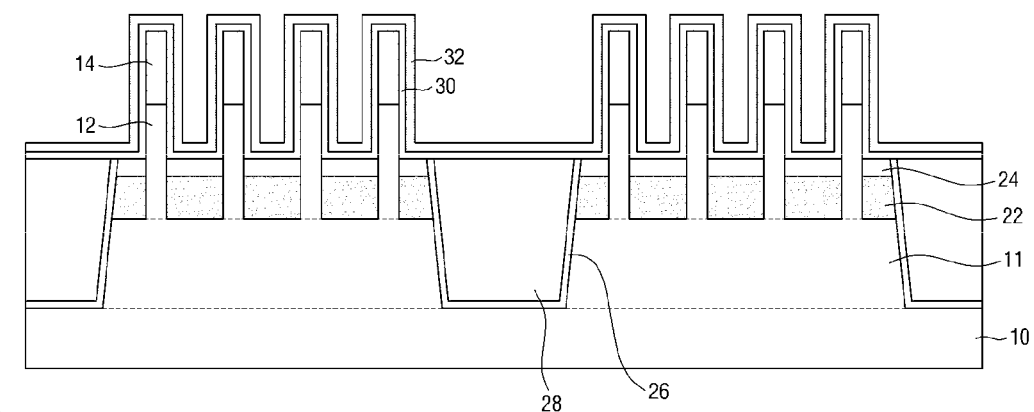

Referring to FIG. 5, a field isolation layer 28 may be formed in the trench 13 and a gate insulating layer 30 and a gate electrode layer 32 may be sequentially formed after the field isolation layer 28 is formed. The field isolation layer 28 may include an insulating material (e.g., a silicon layer including oxygen). The field isolation layer 28 may include multiple layers sequentially stacked. The active liner 26 may extend between the substrate 10 and the field isolation layer 28.

In some embodiments, portions of the active liner 26 formed on the channel region 12 and the mask layer 14 may be removed before forming the gate insulating layer 30, and the gate insulating layer 30 may contact the channel region 12 and the mask layer 14 as illustrated in FIG. 5. In some embodiments, each of the gate insulating layer 30 and the gate electrode layer 32 may have a uniform thickness as illustrated in FIG. 5 and may be formed by, for example, an ALD process. The gate insulating layer 30 may include silicon oxide and/or a high-k material (e.g., hafnium oxide or aluminum oxide). The gate electrode layer 32 may include, for example, a metallic layer (e.g., W, Ti, Cu, and/or Co). In some embodiments, the gate electrode layer 32 may be multiple stacked layers including a work function layer (e.g., TiN, TiAlN, TaAlN, TiAl, TaC, TiC, and/or HfSi) and/or a metallic layer.

Figure 6:
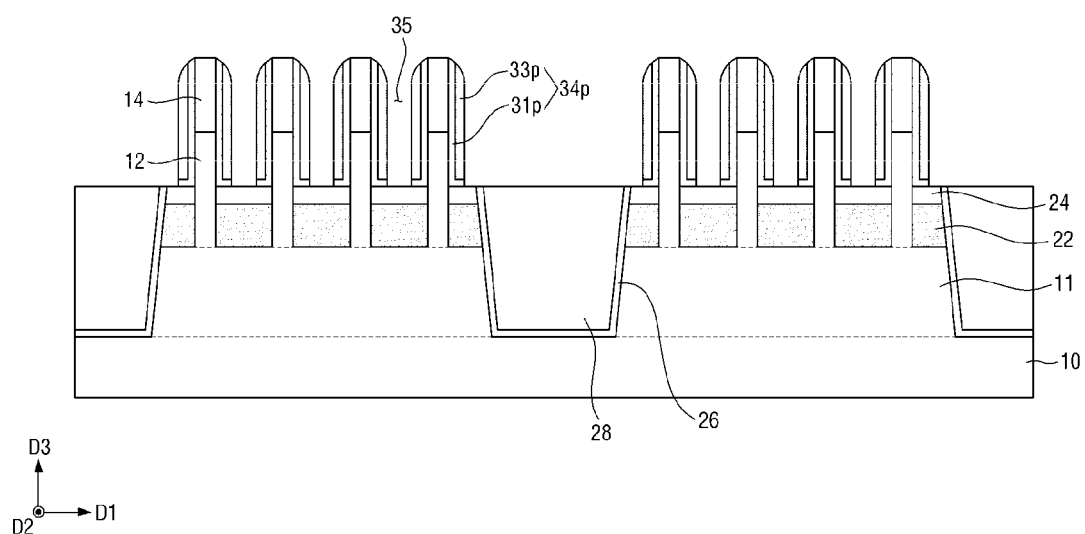

Referring to FIG. 6, an etching process may be performed on the gate electrode layer 32 and the gate insulating layer 30 until the field isolation layer 28 is exposed to form a preliminary gate structure 34p on a side surface of the preliminary channel structure. The etching process may also expose the mask layer 14 and the bottom spacer pattern 24 as illustrated in FIG. 6. The preliminary gate structure 34p may include a preliminary gate insulator 31p and a preliminary gate electrode 33p. Two adjacent preliminary gate structures 34p spaced apart from each other in the first direction D1 may define a gate opening 35 between the two adjacent preliminary gate structures 34p. The etching process may include a wet etching process and/or a dry etching process.

Referring to FIG. 7, a preliminary gate liner 42p, a preliminary sacrificial layer 44p, and a transistor isolation layer 46 may be sequentially formed on the preliminary gate structure 34p. The preliminary gate liner 42p and the preliminary sacrificial layer 44p may fill the gate openings 35, and the transistor isolation layer 46 may not be formed in the gate openings 35. In some embodiments, each of the preliminary gate liner 42p and the preliminary sacrificial layer 44p may have a uniform thickness as illustrated in FIG. 7 and may be formed by, for example, an ALD process.

For example, the preliminary gate liner 42p may include an insulating material including nitride (e.g., a silicon layer including nitrogen and/or oxygen), and the transistor isolation layer 46 may include an insulating material (e.g., a silicon layer including oxygen). The preliminary sacrificial layer 44p may include a material that has an etch selectivity with respect to both the preliminary gate liner 42p and the transistor isolation layer 46. For example, the preliminary sacrificial layer 44p may be a silicon layer (e.g., an amorphous silicon layer) or a metallic layer (e.g., W, Ti, Cu, and/or Co).

Figure 9:
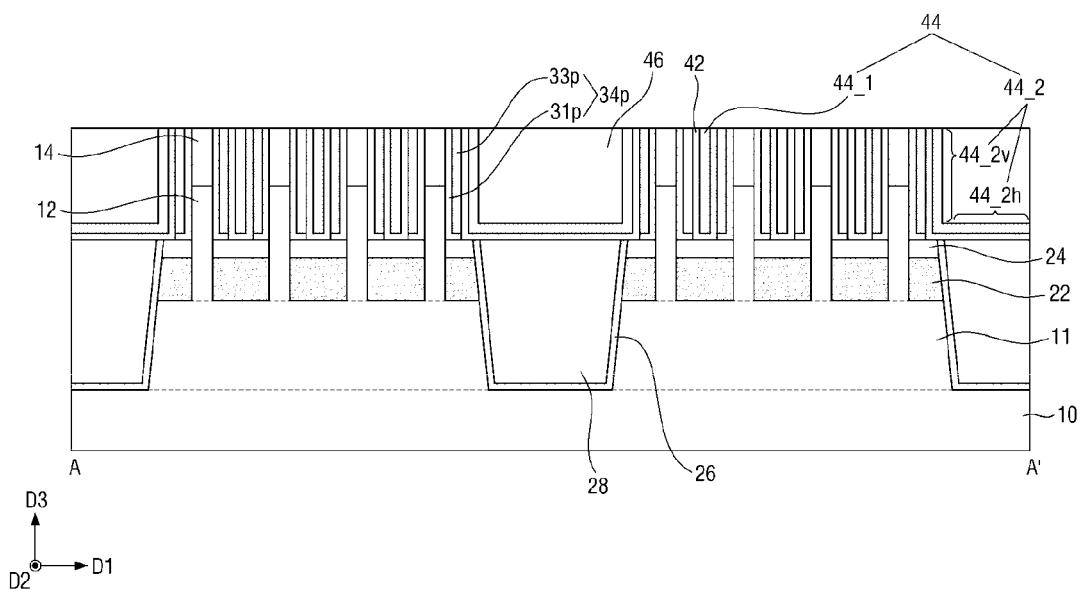

FIG. 9 is a cross-sectional view taken along the line A-A' of FIG. 8. FIG. 8 shows some of the elements shown in FIG. 9, rather than all elements, to simplify the drawing. Referring to FIGS. 8 and 9, upper portions of the transistor isolation layer 46, the preliminary sacrificial layer 44p, and the preliminary gate liner 42p may be removed until the mask layer 14 is exposed to form a sacrificial layer 44 and a gate liner 42 on the preliminary gate structures 34p.

The upper portions of the transistor isolation layer 46, the preliminary sacrificial layer 44p, and the preliminary gate liner 42p may be removed by performing, for example, a planarization process. The planarization process may include a chemical mechanical polishing (CMP) process, a dry etching process and/or a wet etching process. In some embodiments, upper portions of the preliminary gate insulator 31p and the preliminary gate electrode 33p may also be removed.

Referring to FIG. 8, each of the gate liner 42 and the sacrificial layer 44 may enclose the mask layer 14. Further, each of the preliminary gate insulator 31p and the preliminary gate electrode 33p may enclose the mask layer 14. The channel region 12 may have a shape the same as or similar to the mask layer 14 in the plan view. The mask layer 14 may extend longitudinally in a second direction D2. The second direction D2 may be parallel to the upper surface 10u of the substrate 10 and may be a second horizontal direction. The second direction D2 may be perpendicular to the first direction D1.

According to FIGS. 8 and 9, the sacrificial layer 44 may include a first portion 44_1 in the gate opening (e.g., the gate opening 35 in FIG. 6) and a second portion 44_2 on the field isolation layer 28. The second portion 44_2 of the sacrificial layer 44 may include a horizontal portion 44_2h extending in the first direction D1 and a vertical portion 44_2v protruding from the horizontal portion 44_2h of the second portion 44_2 of the sacrificial layer 44 in the third direction D3. In some embodiments, the vertical portion 44_2v of the second portion 44_2 of the sacrificial layer 44 may have a thickness in the first direction D1 equal to a thickness of the horizontal portion 44_2h of the second portion 44_2 of the sacrificial layer 44 in the third direction D3.

The transistor isolation layer 46 may be formed on the horizontal portion 44_2h of the second portion 44_2 of the sacrificial layer 44 and may expose the vertical portion 44_2v of the second portion 44_2 of the sacrificial layer 44 (e.g., an uppermost surface of the vertical portion 44_2v of the second portion 44_2 of the sacrificial layer 44).

Figure 10:
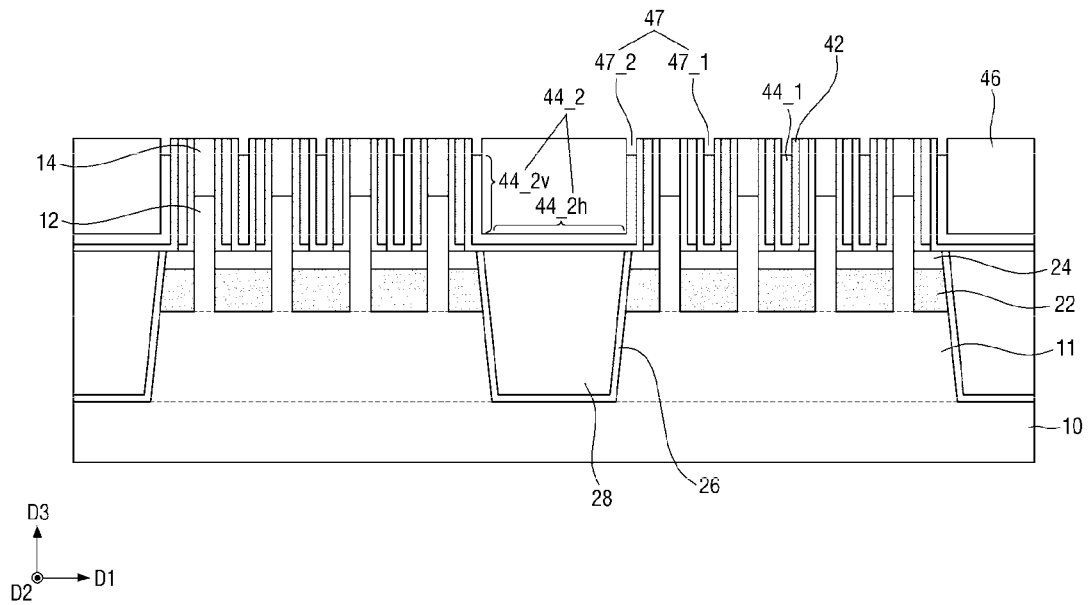

Referring to FIG. 10, an upper portion of the sacrificial layer 44 may be removed to form recess 47. Specifically, an upper portion of the first portion 44_1 of the sacrificial layer 44 may be removed to form a first recess 47_1 on the first portion 44_1 of the sacrificial layer 44. The first recess 47_1 may be defined by the gate liner 42 and the first portion 44_1 of the sacrificial layer 44. Further, an upper portion of the vertical portion 44_2v of the second portion 44_2 of the sacrificial layer 44 may be removed to form a second recess 47_2 on the vertical portion 44_2v of the second portion 44_2 of the sacrificial layer 44. The second recess 47_2 may be defined by the gate liner 42, the vertical portion 44_2v of the second portion 44_2 of the sacrificial layer 44, and the transistor isolation layer 46.

The upper portion of the sacrificial layer 44 may be removed by, for example, a wet etching process and/or a dry etching process. The gate liner 42 and the transistor isolation layer 46 may not be removed while removing the upper portion of the sacrificial layer 44 as illustrated in FIG. 10. In some embodiments, an upper surface of the first portion 44_1 of the sacrificial layer 44 exposed by the first recess 47_1 and an upper surface of the vertical portion 44_2v of the second portion 44_2 of the sacrificial layer 44 exposed by the second recess 47_2 may be flat.

Figure 11:
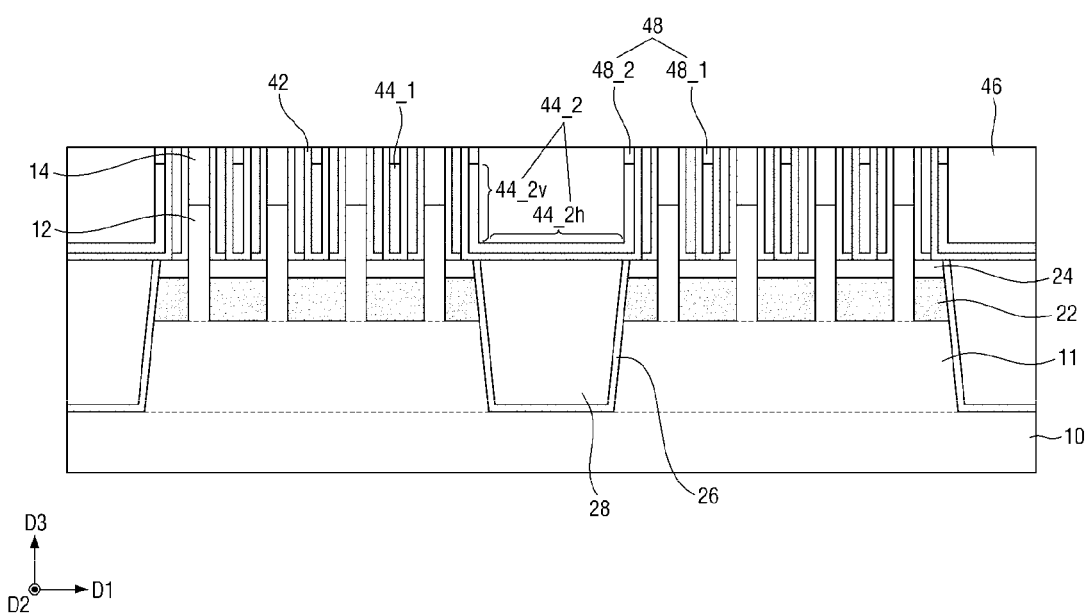

Referring to FIG. 11, a gap capping layer 48 may be formed in the recess 47. A first gap capping layer 48_1 may be formed in the first recess 47_1, and a second gap capping layer 48_2 may be formed in the second recess 47_2. In some embodiments, the first and second gap capping layers 48_1 and 48_2 may fill the first recess 47_1 and the second recess 47_2, respectively. The first and second gap capping layers 48_1 and 48_2 may include an insulating material (e.g., a silicon layer including oxygen) and may include a material that has an etch selectivity with respect to the sacrificial layer 44.

Figure 12:
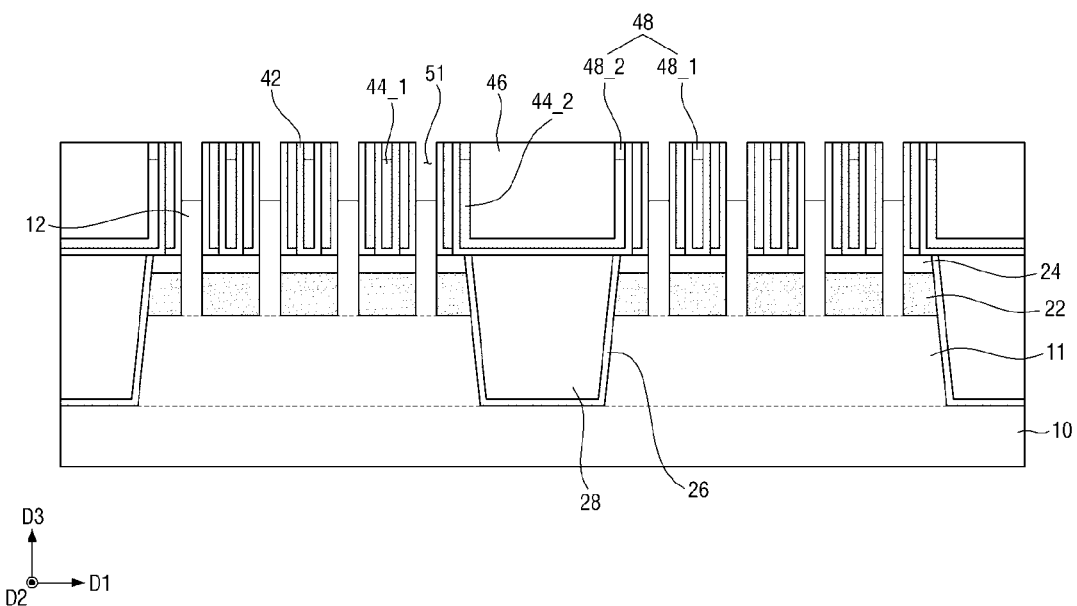

Referring to FIG. 12, the mask layer 14 may be removed and a preliminary top source/drain opening 51 may be formed on the channel region 12. The mask layer 14 may be removed by, for example, a wet etching process and/or a dry etching process.

Figure 13:
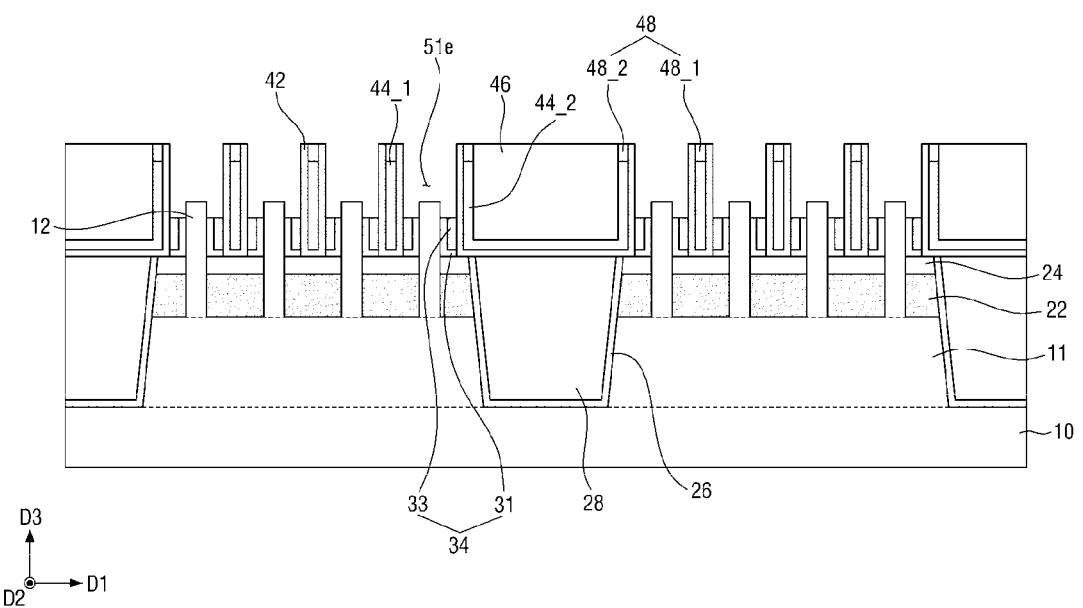

Referring to FIG. 13, an upper portion of the preliminary gate structure 34p that includes the preliminary gate insulator 31p and the preliminary gate electrode 33p may be removed to form a gate structure 34 on a side surface of the channel region 12. An enlarged preliminary source/drain opening 51e may be formed on the channel region 12. In some embodiments, the enlarged preliminary source/drain opening 51e may expose the gate liner 42 (e.g., an upper portion of the gate liner 42) and the channel region 12 (e.g., an upper portion of the channel region 12). In some embodiments, an upper portion of the channel region 12 may protrude from the gate structure 34 as illustrated in FIG. 13. The upper portion of the preliminary gate structure 34p may be removed by, for example, a wet etching process and/or a dry etching process.

The first portion 44_1 of the sacrificial layer 44 and the first gap capping layer 48_1 between two adjacent gate structures 34 may be a preliminary isolation structure. The gate liner 42 may be on opposing sides of the preliminary isolation structure. In some embodiments, the gate liner 42 may contact opposing sides of the first portion 44_1 of the sacrificial layer 44 and opposing sides of the first gap capping layer 48_1 as illustrated in FIG. 13. The gate liner 42 may also extend between the first portion 44_1 of the sacrificial layer 44 and the substrate 10. In some embodiments, the gate liner 42 may contact a lower surface of the first portion 44_1 of the sacrificial layer 44 as illustrated in FIG. 13.

Figure 14:
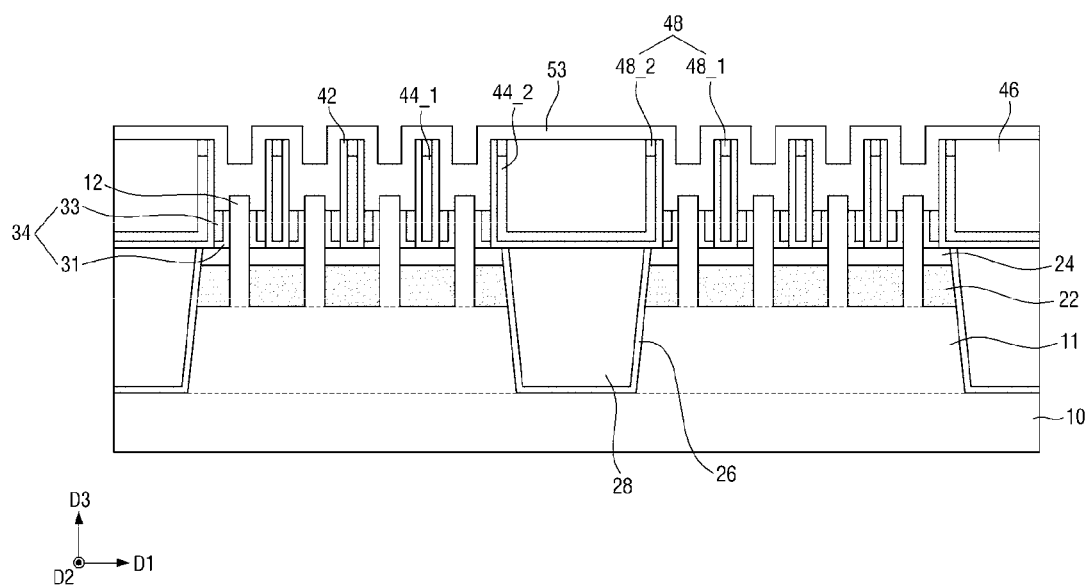

Referring to FIG. 14, a top spacer layer 53 may be formed. In some embodiments, the top spacer layer 53 may have a uniform thickness and may be formed by, for example, an ALD process. The top spacer layer 53 may include the same material as the bottom spacer pattern 24. For example, the top spacer layer 53 may include an insulating material (e.g., silicon oxide, silicon nitride or silicon oxynitride).

Figure 15:
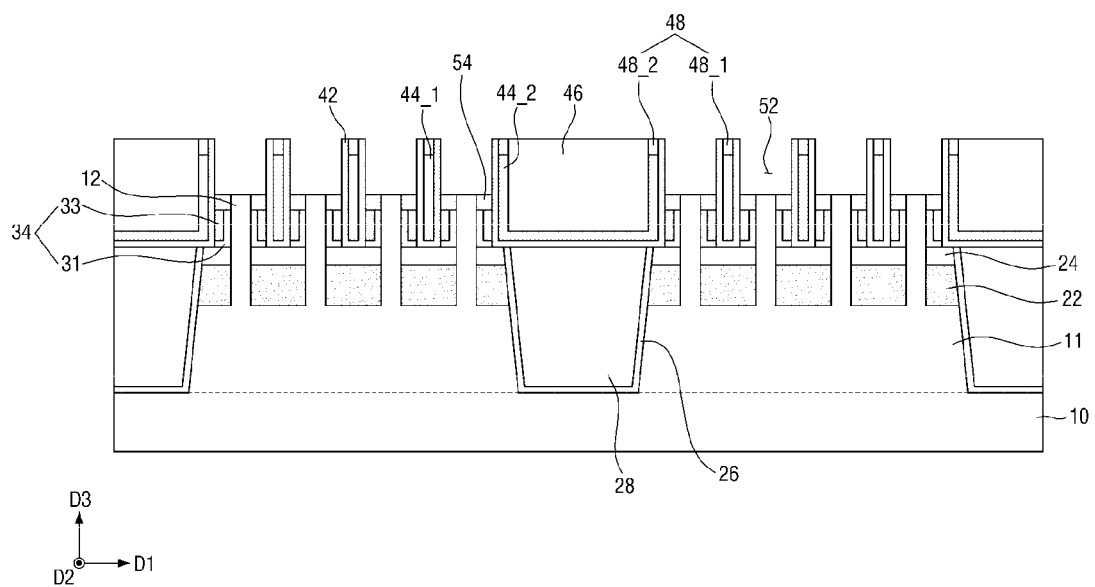

Referring to FIG. 15, a top spacer pattern 54 may be formed on the gate structure 34 by etching the top spacer layer 53, and a top source/drain opening 52 may be formed on the top spacer pattern 54. For example, etching the top spacer layer 53 may be performed by a wet etching process and/or a dry etching process. The top source/drain opening 52 may expose the channel region 12 (e.g., an uppermost surface of the channel region 12). The top spacer pattern 54 may be formed to electrically isolate the gate structure 34 from elements subsequently formed on the gate structure 34 (e.g., a top source/drain region 56 in FIG. 16).

Figure 16:
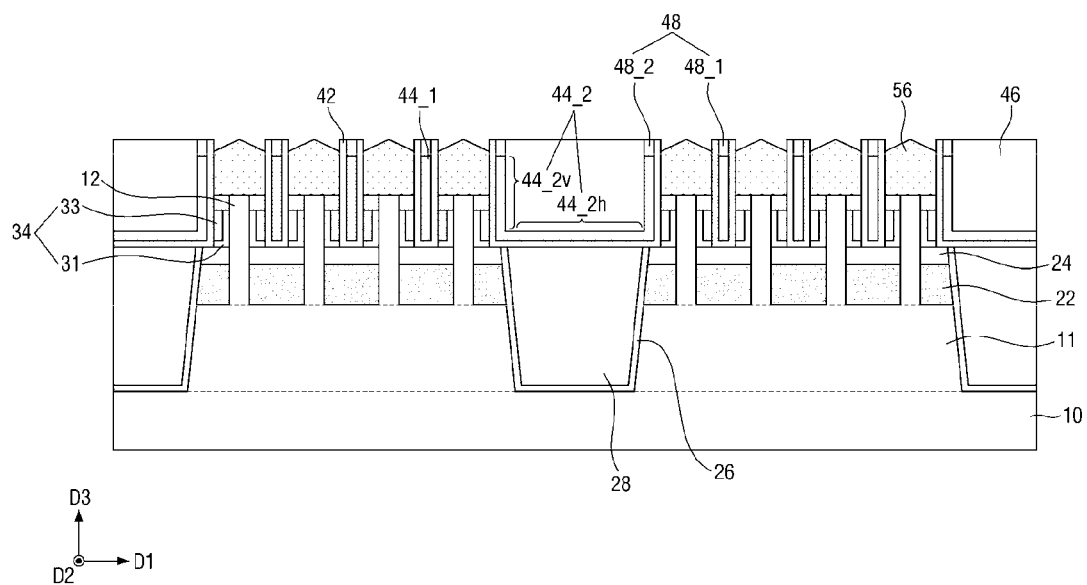

Referring to FIG. 16, a top source/drain region 56 may be formed in the top source/drain opening 52. The top source/drain region 56 may be formed by performing an epitaxial growth process using the channel region 12 as a seed layer. The top source/drain region 56 may be an epitaxial layer including impurity elements (e.g., B, P, and/or As). In some embodiments, the top source/drain region 56 may fill a lower portion of the top source/drain opening 52 and may contact the gate liner 42 as illustrated in FIG. 16. The bottom source/drain region 22 formed in the substrate 10, the channel region 12 and the top source/drain region 56 sequentially stacked on the substrate 10 in the third direction D3, and the gate structure 34 on a side surface of the channel region 12 may form a VFET. In some embodiments, an upper portion of the top source/drain opening 52 may not be filled with the top source/drain region 56 as illustrated in FIG. 16.

Figure 17:
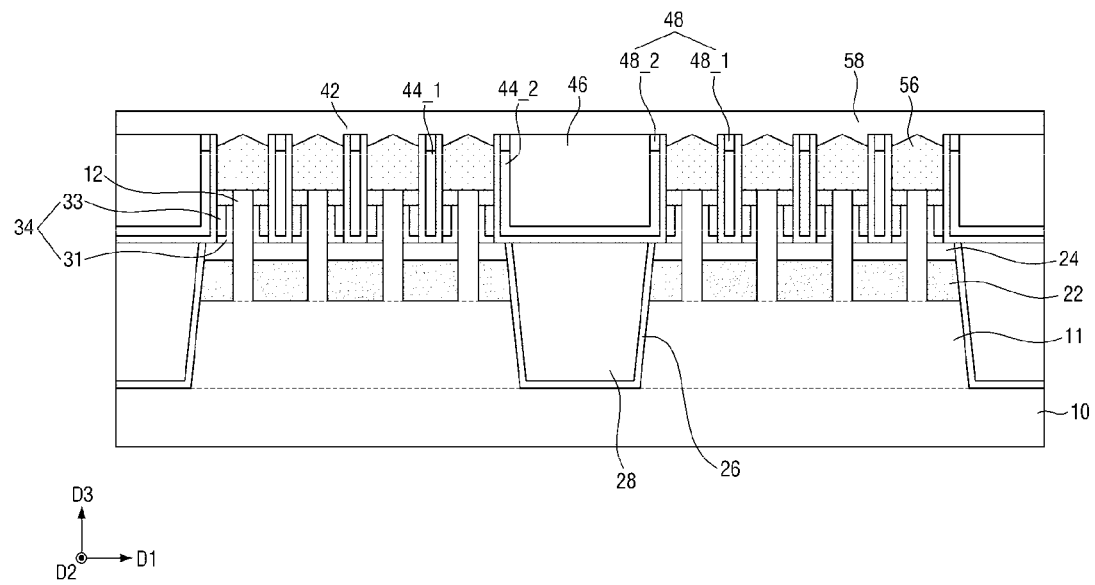

Referring to FIG. 17, a top capping layer 58 may be formed on the top source/drain region 56. The top capping layer 58 may be formed in the top source/drain opening 52 and may extend on the transistor isolation layer 46. The top capping layer 58 may include, for example, an insulating material (e.g., a silicon layer including nitrogen and/or oxygen).

Figure 18:
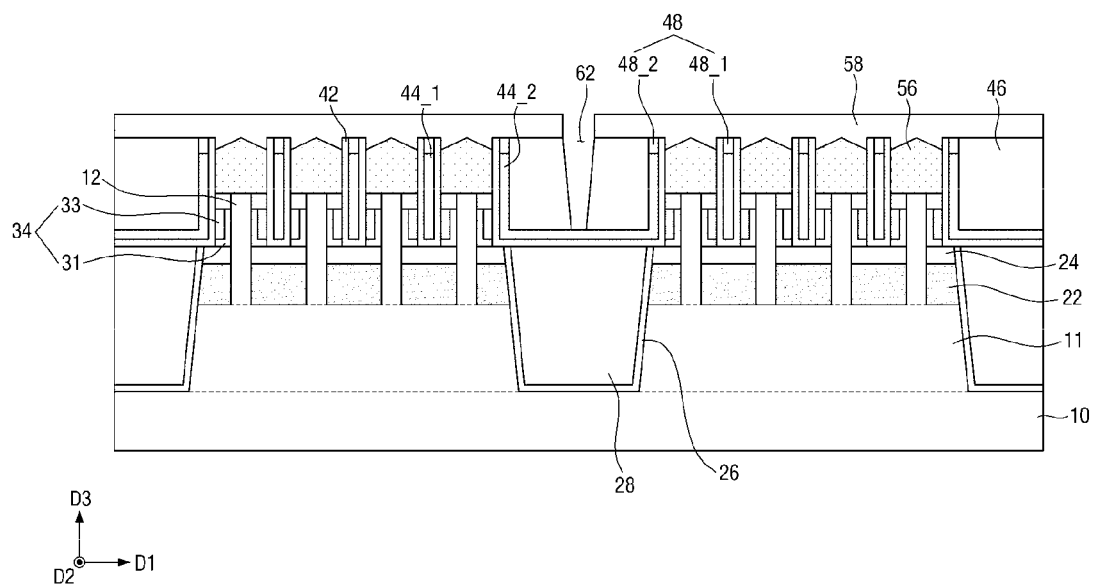

Referring to FIG. 18, an opening 62 may be formed through the top capping layer 58 and the transistor isolation layer 46. The opening 62 may expose the horizontal portion 44_2h of the second portion 44_2 of the sacrificial layer 44 (e.g., an upper surface of the horizontal portion 44_2h of the second portion 44_2 of the sacrificial layer 44).

Figure 19:
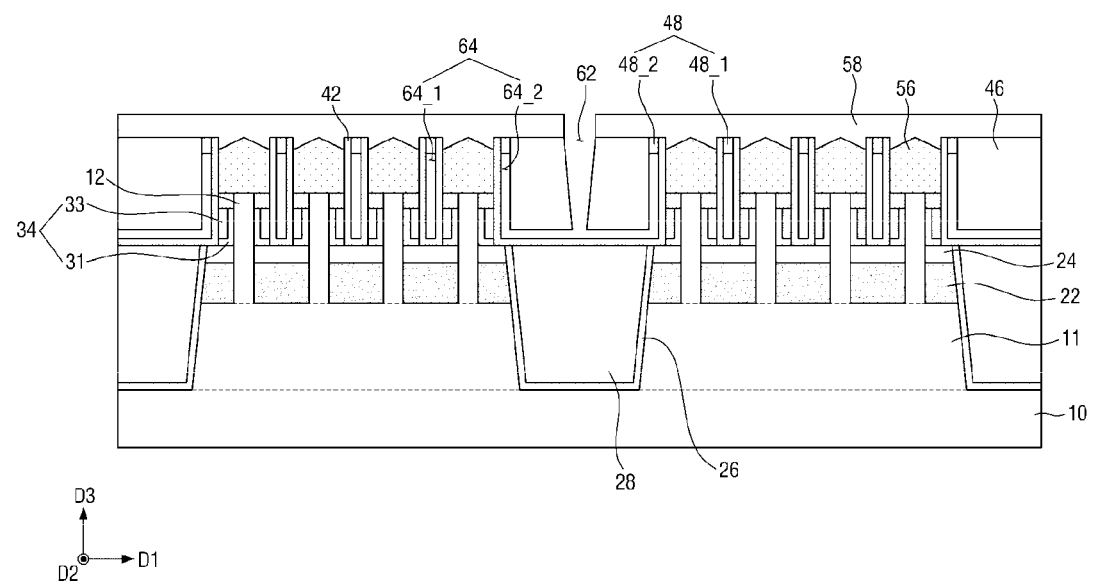

Referring to FIG. 19, the first portion 44_1 and the second portion 44_2 of the sacrificial layer 44 may be removed through the opening 62 to form a first cavity 64_1 and a second cavity 64_2, respectively. For example, the first portion 44_1 and the second portion 44_2 of the sacrificial layer 44 may be removed by performing a wet etching process. The wet etching process may use an etchant including, for example, ammonia. As illustrated in FIG. 19, the sacrificial layer 44 may be removed selectively, and the gate liner 42, the transistor isolation layer 46, and the gap capping layer 48 may not be removed. In some embodiments, the first portion 44_1 and the second portion 44_2 of the sacrificial layer 44 may be entirely removed and may not remain on the gate liner 42, the transistor isolation layer 46, and the gap capping layer 48. Accordingly, the lower surface of the gap capping layer 48 may be exposed to the cavity 64. In some embodiments, an entirety of the lower surface of the gap capping layer 48 may be exposed to the cavity 64. In some embodiments, the lower surface of the gap capping layer 48 may be flat as illustrated in FIG. 19.

The top source/drain region 56 may include a lower surface that faces the substrate 10 and may be closer to the substrate 10 than the lower surface of the gap capping layer 48. Accordingly, a portion of the first cavity 64_1 may be between two adjacent top source/drain regions 56 as illustrated in FIG. 19. The cavity 64 may not include liquid or solid therein. The cavity 64 may be, for example, a gap filled with air (e.g., an air-gap), a gap filled with an inert gas or gases (e.g., an inert gas gap), a gap defining a vacuum (e.g., a vacuum gap), etc. The cavity 64 may reduce a parasitic capacitance between neighboring conductive elements (e.g., gate structures 34).

FIG. 20 is a cross-sectional view taken along the line C-C' of FIG. 21, and FIG. 21 is a plan view taken along the line B-B' of FIG. 20. FIG. 21 shows some of the elements shown in FIG. 20, rather than all elements, to simply the drawing. Referring to FIG. 20, an isolation plug 66 may be formed in the opening 62. The isolation plug 66 may include an insulating material (e.g., a silicon layer including nitrogen and/or oxygen). The isolation plug 66 may be formed by a deposition process that has a poor step coverage and may not be formed in the first cavity 64_1 and the second cavity 64_2.

The first cavity 64_1 may be enclosed by the gate liner 42 and the first gap capping layer 48_1, and the second cavity 64_2 may be enclosed by the gate liner 42, the second gap capping layer 48_2, and the transistor isolation layer 46. A lower portion of the isolation plug 66 may be in the second cavity 64_2. In some embodiments, the isolation plug 66 may overlap the field isolation layer 28 as illustrated in FIG. 20 but the present inventive concept is not limited thereto. For example, in some embodiments, the isolation plug 66 may be formed to overlap the active region 11.

Referring to FIG. 21, the first cavity 64_1 and the second cavity 64_2 may be connected to each other, and the top source/drain region 56 may be enclosed by the first cavity 64_1 and the second cavity 64_2 in a plan view.

FIG. 22 is a cross-sectional view taken along the line D-D' of FIG. 23. Referring to FIG. 22, a contact isolation layer 72 and a top source/drain contact 74 may be formed after the cavity 64 is formed. The contact isolation layer 72 may be formed after the cavity 64 is formed and then a portion of the contact isolation layer 72 may be removed to form a contact hole that extends through the contact isolation layer 72 and the top capping layer 58 and exposes the top source/drain region 56 (e.g., an upper surface of the top source/drain region 56). The top source/drain contact 74 may be formed in the contact hole and may contact the top source/drain region 56. In some embodiments, the top source/drain contact 74 may contact multiple top source/drain regions 56 as illustrated in FIG. 22.

For example, the contact isolation layer 72 may include an insulating material (e.g., a silicon layer including oxygen), and the top source/drain contact 74 may include metal (e.g., Al, W, and/or Cu). In some embodiments, the top source/drain contact 74 may include a metal nitride layer and a metal layer sequentially stacked. Although FIG. 22 shows a single contact (i.e., the top source/drain contact 74), multiple contacts may be formed in the contact isolation layer 72. For example, a gate contact (e.g., a gate contact 76 in FIGS. 32 and 33) contacting the gate electrode 33 and/or a bottom source/drain contact (e.g., a bottom source/drain contact 78 in FIGS. 32 and 33) contacting the bottom source/drain region 22 may be formed in the contact isolation layer 72.

Figure 24:
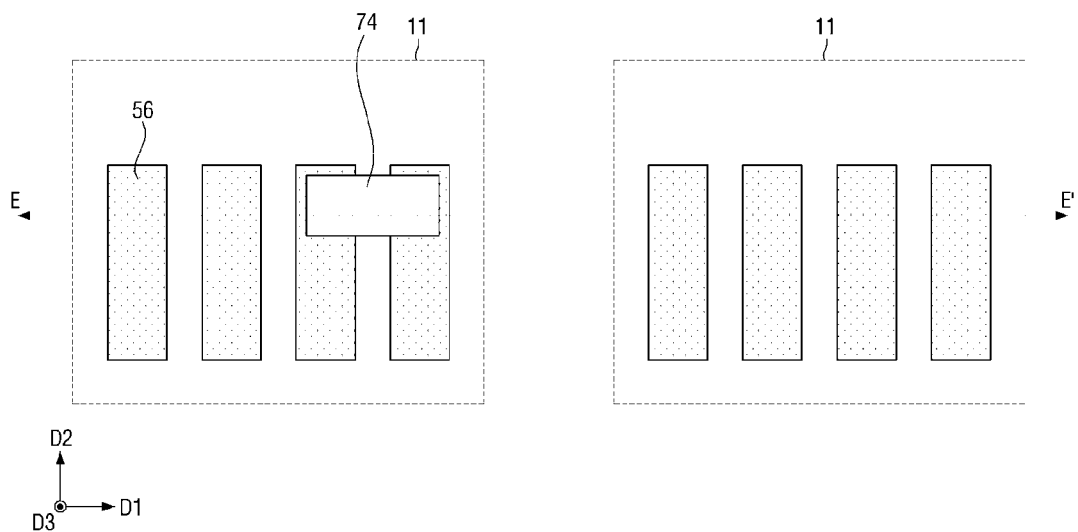
FIGS. 24 and 28 are plan views.
Figure 26:
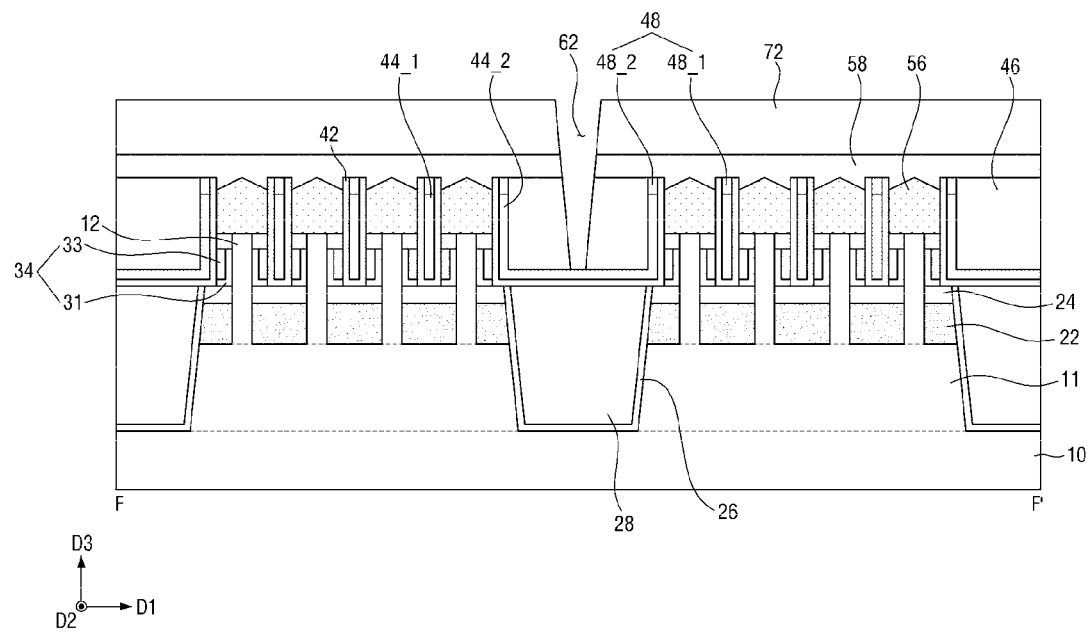
Figure 27:
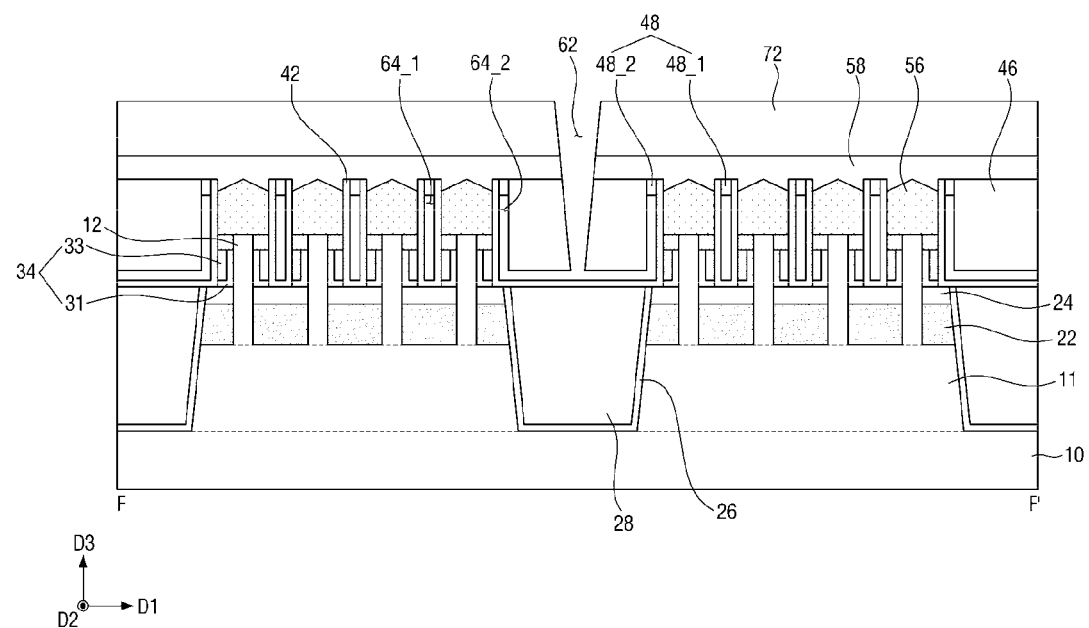
Figure 28:
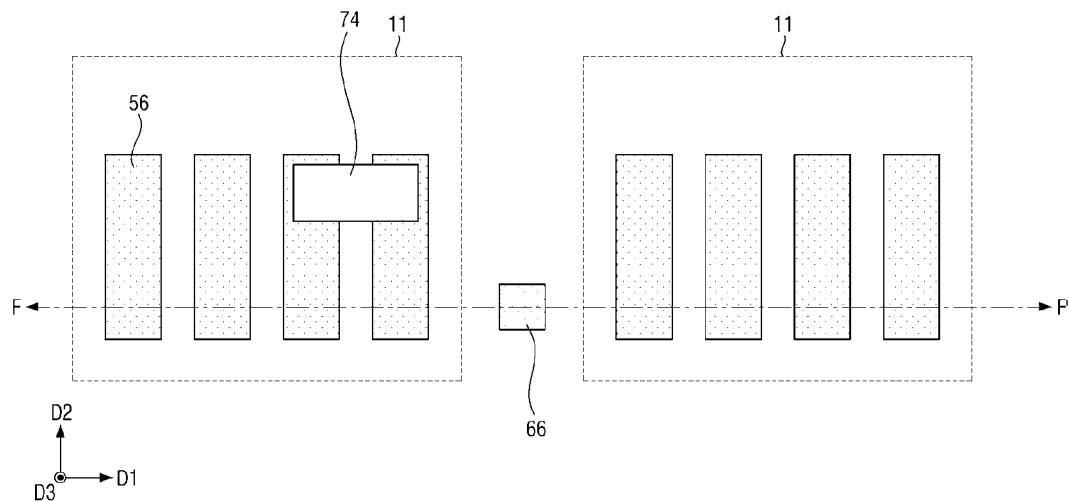

FIGS. 24 and 28 are plan views, and FIGS. 25 through 27 and 29 are cross-sectional views illustrating methods of forming an integrated circuit device including VFETs according to some embodiments of the present inventive concept.

Figure 25:
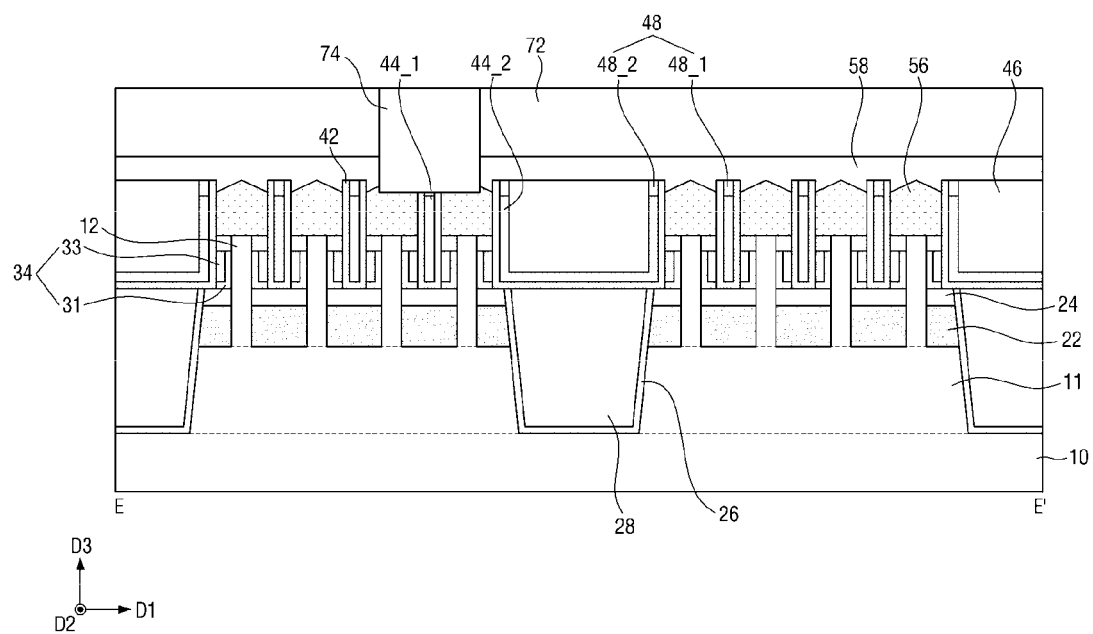
FIGS. 25 through 27 and 29 are cross-sectional views illustrating methods of forming an integrated circuit device including VFETs according to some embodiments of the present inventive concept.
Figure 29:
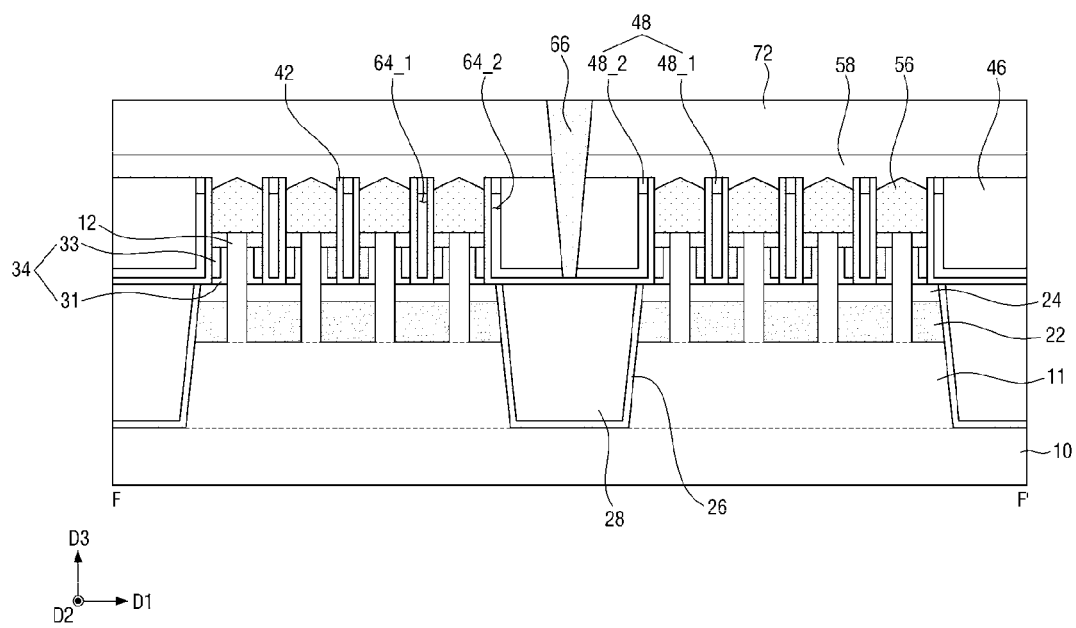

FIG. 24 shows some of the elements shown in FIG. 25, rather than all elements, to simply the drawing. FIG. 25 is a cross-sectional view taken along the line E-E' of FIG. 24. FIG. 28 also shows some of the elements shown in FIG. 29, rather than all elements, to simply the drawing. FIGS. 26, 27, and 29 are cross-sectional views taken along the line F-F' of FIG. 28.

Referring to FIGS. 24 and 25, a contact isolation layer 72 may be formed on the top capping layer 58 after processes that are the same or similar to those described in FIGS. 4 through 17 are performed and then a top source/drain contact 74 may be formed in the contact isolation layer 72. The top source/drain contact 74 may extend through the contact isolation layer 72 and the top capping layer 58 and may contact the top source/drain region 56.

Referring to FIG. 26, an opening 62 that extends through the contact isolation layer 72, the top capping layer 58, and the transistor isolation layer 46 and exposes the second portion 44_2 of the sacrificial layer 44 (e.g., an upper surface of the second portion 44_2 of the sacrificial layer 44) may be formed. Referring to FIG. 27, the first portion 44_1 and the second portion 44_2 of the sacrificial layer 44 may be removed through the opening 62 to form a first cavity 64_1 and a second cavity 64_2, respectively.

Referring to FIG. 29, an isolation plug 66 may be formed in the opening 62. Although FIGS. 28 and 29 show that the isolation plug 66 is between the active regions 11 and overlaps the field isolation layer 28, the present inventive concept is not limited thereto. In some embodiments, the isolation plug 66 may be formed to overlap the active region 11.

As the first cavity 64_1 and the second cavity 64_2 are formed after forming the top source/drain contact 74, a conductive material of the top source/drain contact 74 may not be formed in the first cavity 64_1 and the second cavity 64_2 and thus issues associated with the conductive material of the top source/drain contact 74 in the first cavity 64_1 and the second cavity 64_2 may be reduced.

Figure 30:
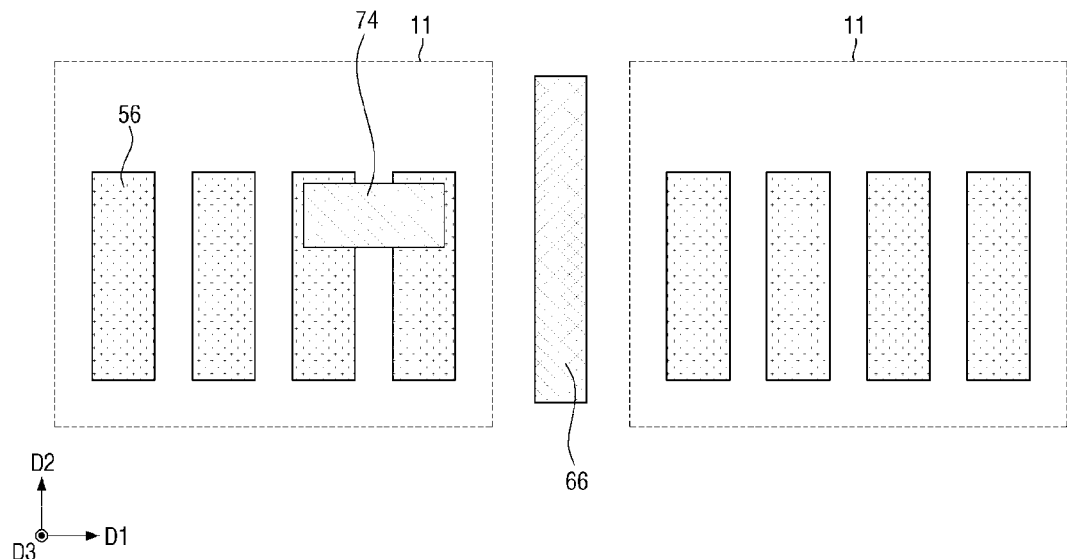
FIGS. 30, 31, and 32 are plan views of an integrated circuit device including VFETs according to some embodiments of the present inventive concept.
Figure 31:
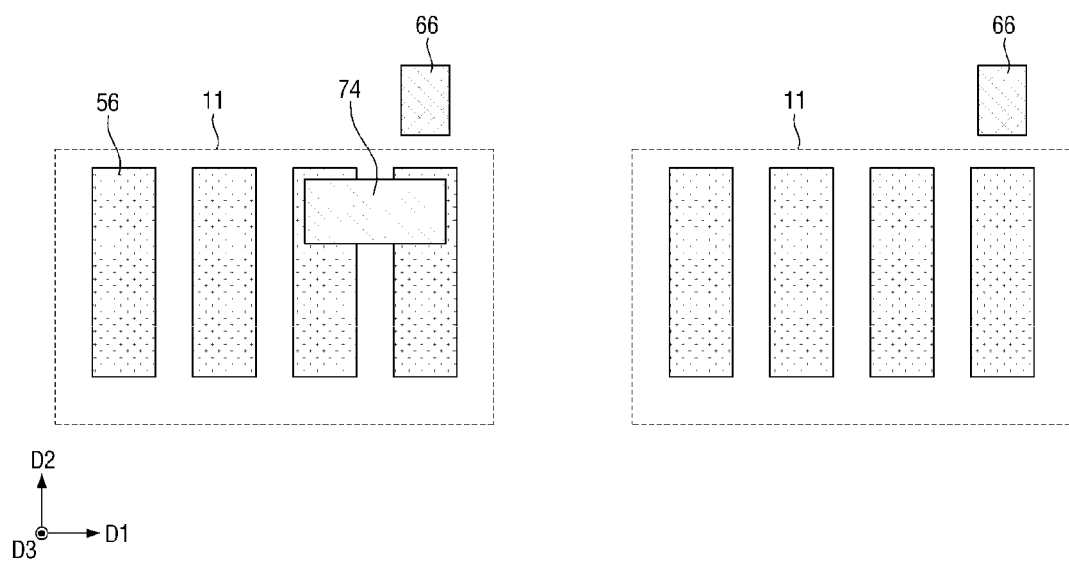
Figure 32:
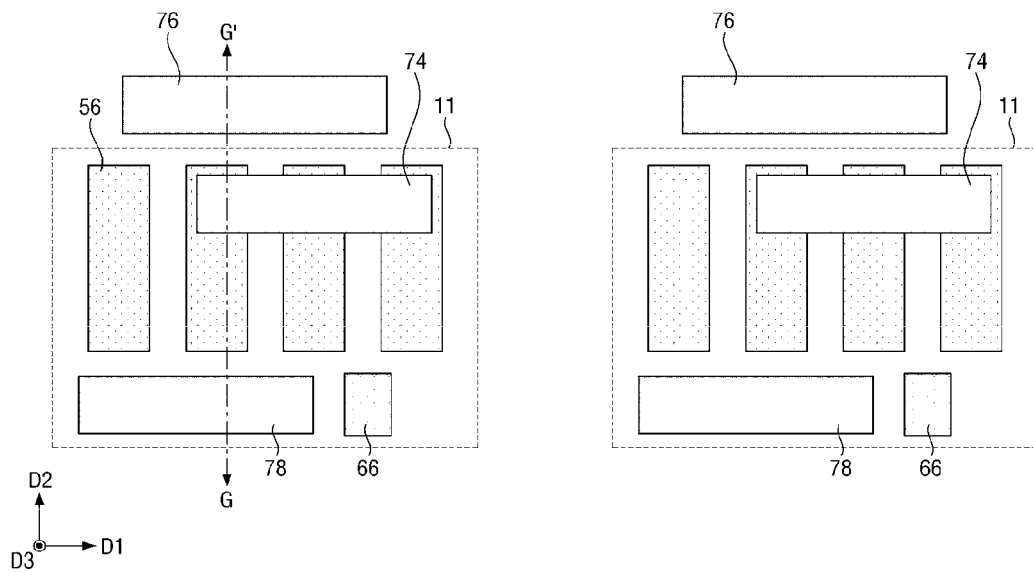
Figure 33:
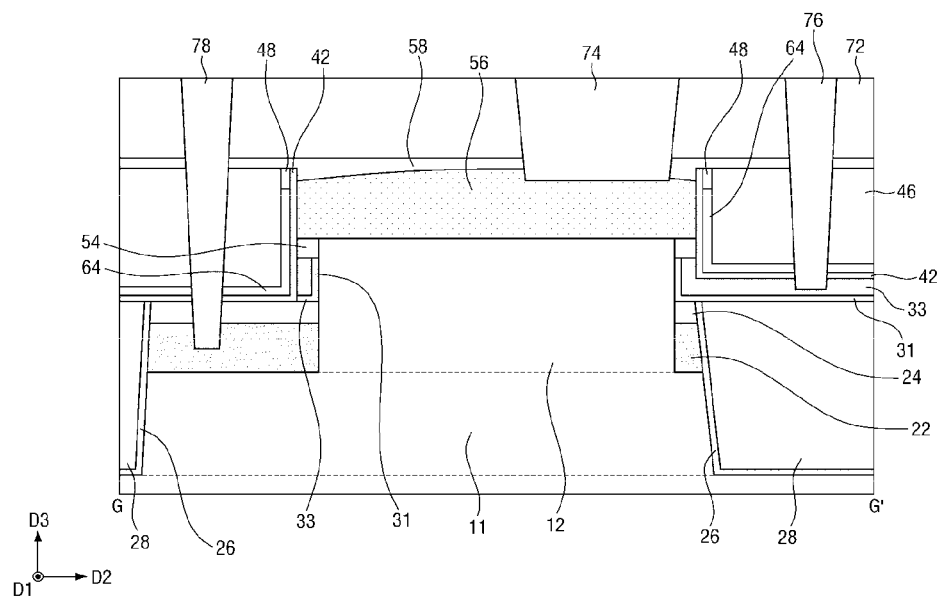
FIG. 33 is a cross-sectional view of an integrated circuit device including VFETs according to some embodiments of the present inventive concept.

FIGS. 30, 31, and 32 are plan views of an integrated circuit device including VFETs according to some embodiments of the present inventive concept. FIGS. 30, 31, and 32 are similar to the plan view of FIG. 28 and show some of the elements shown in FIG. 29, rather than all elements, to simply the drawing. FIG. 33 is a cross-sectional view taken along the line G-G' of FIG. 32 according to some embodiments of the present inventive concept.

Referring to FIG. 30, the isolation plug 66 may have a line shape extending longitudinally in the second direction D2. In some embodiments, the isolation plug 66 may have a length in the second direction D2, which is longer than a length of the top source/drain region 56 in the second direction D2 as illustrated in FIG. 30.

Referring to FIG. 31, multiple isolation plugs 66 may be formed outside of the active regions 11. In some embodiments, two isolation plugs 66 may be formed, and the isolation plug 66 may be spaced apart from the active regions 11 in the second direction D2 as illustrated in FIG. 31.

Referring to FIG. 32, multiple isolation plugs 66 may be formed on the active regions 11. In some embodiments, two isolation plugs 66 may be formed, and each of the isolation plugs 66 may be formed on a single active region 11 as illustrated in FIG. 32. In some embodiments, the top source/drain contact 74 may contact three top source/drain regions 56 as illustrated in FIG. 32 but the present inventive concept is not limited thereto. For example, the top source/drain contact 74 may contact all four top source/drain regions 56 on a single active region 11.

Referring to FIGS. 32 and 33, a gate contact 76 contacting the gate electrode 33 may be formed. The gate contact 76 may extend through the contact isolation layer 72, the top capping layer 58, the transistor isolation layer 46, and the gate liner 42. In some embodiments, the gate contact 76 may have a line shape extending longitudinally in the first direction D1 as illustrated in FIG. 32 but the present inventive concept is not limited thereto.

Referring to FIGS. 32 and 33, a bottom source/drain contact 78 contacting the bottom source/drain region 22 may be formed. The bottom source/drain contact 78 may extend through the contact isolation layer 72, the top capping layer 58, the transistor isolation layer 46, the gate liner 42, and bottom spacer pattern 24. In some embodiments, the bottom source/drain contact 78 may have a line shape extending longitudinally in the first direction D1 as illustrated in FIG. 32 but the present inventive concept is not limited thereto.

In some embodiments, each of the top source/drain contact 74, the gate contact 76, and the bottom source/drain contact 78 may include multiple layers sequentially stacked as illustrated in FIG. 33. For example, each of the top source/drain contact 74, the gate contact 76, and the bottom source/drain contact 78 may include a metal nitride layer and a metal layer. However, the present inventive concept is not limited thereto. For example, each of the top source/drain contact 74, the gate contact 76, and the bottom source/drain contact 78 may include a single layer. In some embodiments, the top source/drain contact 74, the gate contact 76, and the bottom source/drain contact 78 may be formed using the same deposition process. In some embodiments, upper surfaces of the top source/drain contact 74, the gate contact 76, and the bottom source/drain contact 78 may be coplanar with each other as illustrated in FIG. 33.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing. Like reference numbers refer to like elements throughout.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
a first vertical field-effect transistor (VFET) and a second VFET on a substrate, wherein
each of the first VFET and the second VFET comprises a bottom source/drain region in the substrate, a channel region, and a top source/drain region that are sequentially stacked on the substrate in a vertical direction, and a gate structure on a side surface of the channel region, and
wherein the first VFET comprises a first side surface facing the second VFET, and the second VFET comprises a first side surface facing the first VFET;
a gate liner comprises a first gate liner continuously extending from the first side surface of the first VFET onto the first side surface of the second VFET, and a second gate liner continuously extending from a second side surface of the first VFET onto an upper surface of the substrate, wherein the second side surface of the first VFET is opposite to the first side surface of the first VFET;
a first gap capping layer that is between the first side surface of the first VFET and the first side surface of the second VFET and comprises opposing side surfaces contacting the first gate liner;
a transistor isolation layer that is on the second gate liner and is spaced apart from the second gate liner; and
a second gap capping layer that is adjacent to an upper surface of the transistor isolation layer and contacts the second gate liner and the transistor isolation layer,
wherein the first gate liner and the first gap capping layer enclose a first cavity, and
the second gate liner, the second gap capping layer, and the transistor isolation layer enclose at least a portion of a second cavity.

2. The integrated circuit device of claim 1, wherein the first gap capping layer comprises a lower surface facing the substrate, and each of the top source/drain regions comprises a lower surface facing the substrate, and
wherein the lower surfaces of the top source/drain regions are closer to the substrate than the lower surface of the first gap capping layer.

3. The integrated circuit device of claim 1, wherein the first gap capping layer comprises a lower surface facing the substrate, and the lower surface of the gap capping layer is flat.

4. The integrated circuit device of claim 1, wherein the transistor isolation layer is spaced apart from the second gate liner by the second cavity therebetween.

5. The integrated circuit device of claim 1, wherein the second cavity has a horizontal portion that is between the transistor isolation layer and the upper surface of the substrate, and a vertical portion that extends on the second side surface of the first VFET.

6. The integrated circuit device of claim 5, further comprising a field isolation layer in the substrate,
wherein the horizontal portion of the second cavity overlaps the field isolation layer.

7. The integrated circuit device of claim 1, further comprising an isolation plug extending through the transistor isolation layer, wherein a portion of the isolation plug is in the second cavity.

8. The integrated circuit device of claim 1, wherein at least one of the first and second cavities comprises an airgap.

9. An integrated circuit device comprising:
a first vertical field-effect transistor (VFET) and a second VFET on a substrate, wherein
each of the first VFET and the second VFET comprises a plurality of bottom source/drain regions in the substrate, a plurality of channel regions, and a plurality of top source/drain regions that are sequentially stacked on the substrate in a vertical direction, and a plurality of gate structures on a side surface of the plurality of channel regions, and
wherein the first VFET comprises a first side surface facing the second VFET, and the second VFET comprises a first side surface facing the first VFET;
a gate liner comprises a first gate liner continuously extending from the first side surface of the first VFET onto the first side surface of the second VFET and a second gate liner continuously extending from a second side surface of the first VFET onto an upper surface of the substrate, wherein the second side surface of the first VFET is opposite to the first side surface of the first VFET;

a transistor isolation layer that is on the second gate liner and is spaced apart from the second gate liner;

a gap capping layer comprises a first gap capping layer that is between the first side surface of the first VFET and the first side surface of the second VFET and comprises opposing side surfaces contacting the first gate liner, and a second gap capping layer that is adjacent to an upper surface of the transistor isolation layer and contacts the second gate liner and the transistor isolation layer;

an isolation plug extending through the transistor isolation layer;

a first cavity that is between the top source/drain regions; and a second cavity that is between one of the top source/drain regions and the isolation plug.

10. The integrated circuit device of claim 9, wherein the first gate liner and the first gap capping layer enclose the first cavity, and the second gate liner, the second gap capping layer, and the transistor isolation layer enclose at least a portion of the second cavity.

11. The integrated circuit device of claim 9, wherein the first gap capping layer comprises a lower surface facing the substrate, and each of the top source/drain regions comprises a lower surface facing the substrate, and wherein the lower surfaces of the top source/drain regions are closer to the substrate than the lower surface of the first gap capping layer.

12. The integrated circuit device of claim 9, wherein the second cavity has a horizontal portion that is between the transistor isolation layer and the upper surface of the substrate, and a vertical portion that extends on the second side surface of the first VFET.

13. The integrated circuit device of claim 12, further comprising a field isolation layer in the substrate, wherein the horizontal portion of the second cavity overlaps the field isolation layer.

14. The integrated circuit device of claim 9, wherein a portion of the isolation plug is in the second cavity.

15. The integrated circuit device of claim 9, wherein at least one of the first and second cavities comprises an airgap.

16. The integrated circuit device of claim 9, wherein the gate liner is an insulating layer comprising nitride.

17. An integrated circuit device comprising:

a first vertical field-effect transistor (VFET) and a second VFET on a substrate, wherein each of the first VFET and the second VFET comprises a plurality of bottom source/drain regions in the substrate, a plurality of channel regions, and a plurality of top source/drain regions that are sequentially stacked on the substrate in a vertical direction, and a plurality of gate structures on a side surface of the plurality of channel regions, and wherein the first VFET comprises a first side surface facing the second VFET, and the second VFET comprises a first side surface facing the first VFET;

a gate liner comprises a first gate liner continuously extending from the first side surface of the first VFET onto the first side surface of the second VFET, and a second gate liner continuously extending from a second side surface of the first VFET onto an upper surface of the substrate, wherein the second side surface of the first VFET is opposite to the first side surface of the first VFET;

a transistor isolation layer that is on the second gate liner and is spaced apart from the second gate liner;

a gap capping layer comprises a first gap capping layer that is between the first side surface of the first VFET and the first side surface of the second VFET and comprises opposing side surfaces contacting the first gate liner, and a second gap capping layer that is adjacent to an upper surface of the transistor isolation layer and contacts the second gate liner and the transistor isolation layer;

an isolation plug extending through the transistor isolation layer;

a field isolation layer in the substrate;

a first cavity overlapping each the bottom source/drain regions; and a second cavity at least partially overlapping the field isolation layer.

18. The integrated circuit device of claim 17, wherein the first cavity is between the top source/drain regions and does not overlap with the top source/drain regions, and a second cavity is between one of the top source/drain regions and the isolation plug.

19. The integrated circuit device of claim 17, wherein the first gate liner and the first gap capping layer enclose the first cavity, and the second gate liner, the second gap capping layer, and the transistor isolation layer enclose at least a portion of the second cavity.

20. The integrated circuit device of claim 17, wherein the second cavity has a horizontal portion that is between the transistor isolation layer and the upper surface of the substrate, and a vertical portion that extends on the second side surface of the first VFET, and the horizontal portion of the second cavity overlaps the field isolation layer.

* * * * *